United States Patent [19]

Dueber et al.

[11] 4,454,218

[45] Jun. 12, 1984

[54] N-ALKYLINDOLYLIDENE AND N-ALKYLBENZO-THIAZOLYLIDENE ALKANONES AS SENSITIZERS FOR PHOTOPOLYMER COMPOSITIONS

[75] Inventors: Thomas E. Dueber, Wilmington, Del.; William J. Link, deceased, late of Wilmington, Del., by Elizabeth T. Link, executrix

[73] Assignee: E. I. Du Pont de Nemours and Company, Wilmington, Del.

[21] Appl. No.: 417,682

[22] Filed: Sep. 13, 1982

[51] Int. Cl.³ .................. G03C 1/68; G03C 1/94; G03C 1/76
[52] U.S. Cl. .................. 430/277; 430/275; 430/271; 430/910; 430/905; 430/281; 430/288; 430/926; 430/916; 204/159.23; 204/159.24
[58] Field of Search ............... 430/282, 926, 916, 905, 430/908, 910, 913, 922, 281, 288, 271, 275, 277, 343, 920; 204/159.24, 159.23, 159.17; 526/914; 523/125

[56] References Cited

U.S. PATENT DOCUMENTS

| | | | |
|---|---|---|---|
| 3,479,185 | 11/1969 | Chambers | 96/84 |
| 3,549,367 | 12/1970 | Chang et al. | 96/35.1 |
| 3,652,275 | 3/1972 | Baum et al. | 96/48 |
| 3,697,280 | 10/1972 | Strilko | 430/281 X |
| 3,870,524 | 3/1975 | Watanabe et al. | 430/281 |
| 3,916,069 | 10/1975 | Tiers et al. | 430/343 X |
| 4,058,443 | 11/1977 | Murata et al. | 430/922 X |
| 4,062,686 | 12/1977 | Van Allan et al. | 430/281 |
| 4,162,162 | 7/1979 | Dueber | 96/115 P |
| 4,258,121 | 3/1981 | Kojima | 430/908 X |
| 4,259,432 | 3/1981 | Kondoh et al. | 430/281 |
| 4,284,707 | 8/1981 | Nagasawa et al. | 430/908 X |
| 4,290,870 | 9/1981 | Kondoh et al. | 430/281 X |
| 4,341,860 | 7/1982 | Sysak | 430/916 X |

FOREIGN PATENT DOCUMENTS

57-21401 2/1982 Japan ........................... 204/159.23

OTHER PUBLICATIONS

"Spectrum" pp. 1432-1433, *The Focal Encyclopedia of Photography* (Desk Edition), McGraw-Hill Book Company, New York, 1969.

*Primary Examiner*—John E. Kittle
*Assistant Examiner*—Cynthia Hamilton

[57] ABSTRACT

Photopolymerizable compositions comprising (a) at least one ethylenically unsaturated compound, (b) at least one photoinitiator or photoinitiator system, (c) sensitizing amount of an N-alkylindolylidene or N-alkylbenzothiazolylidene alkanone as defined, and optionally (d) at least one organic polymeric binder. The compositions, in layer form are useful in printing plates, litho films, photoresists, solder mask and for making image proofs. The products show sensitization to visible light.

17 Claims, No Drawings

N-ALKYLINDOLYLIDENE AND N-ALKYLBENZO-THIAZOLYLIDENE ALKANONES AS SENSITIZERS FOR PHOTOPOLYMER COMPOSITIONS

DESCRIPTION

1. Technical Field

This invention relates to new photopolymerizable compositions. More particularly this invention relates to photopolymerizable compositions containing photoinitiators or photoinitiator systems in combination with selected N-alkylindolylidene and N-alkylbenzothiazolylidene alkanones as sensitizers.

2. Background Art

Photopolymerizable compositions are widely used for an increasing number of usages. For example this type of composition is now commercially used in printing, copying, resist formation, etc. Such compositions generally contain an ethylenically unsaturated compound or other type polymerizable compound, a photoinitiator or photoinitiator system and preferably a solvent-soluble or aqueous or alkaline soluble organic polymeric binder compound. Many of the known useful photopolymerizable compositions are limited in applicability because the initiators are not as active as desired and/or these initiators are activatable primaily in the ultraviolet region of the spectrum.

Chambers U.S. Pat. No. 3,479,185 discloses photopolymerizable compositions containing an ethylenically unsaturated monomer, a free radical producing agent such as a leuco triphenylamine dye and a hexaarylbiimidazole. These compositions are photoinitiatable in the ultraviolet region of the spectrum. Chambers, however, found that by adding energy-transfer dyes of the xanthene and acridine classes the sensitivity of the photopolymerizable compositions was extended into the visible spectral region with an increase in speed of polymerization.

Chang U.S. Pat. No. 3,549,367 discloses photopolymerizable compositions containing hexaarylbiimidazoles and p-aminophenyl ketones, e.g., Michler's ketone, which extend the spectral sensitivity of the compositions slightly into the visible region of the spectrum.

Baum and Henry U.S. Pat. No. 3,652,275 enhances the efficiency of the hexaarylbiimidazole systems in photopolymerizable compositions through the use of selected bis-(p-dialkylaminobenzylidene) ketone sensitizers.

While the aforementioned compositions have provided visible light sensitization of photopolymer compositions, improvement in photospeed is desirable as well as increasingly improved sensitivity in the visible region of the spectrum.

DISCLOSURE OF THE INVENTION

In accordance with this invention there is provided a photopolymerizable composition comprising an admixture of (a) at least one nongaseous ethylenically unsaturated compound having at least one terminal ethylenically unsaturated group, a boiling point above 100° C. at normal atmospheric pressure and being capable of addition polymerization, (b) at least one photoinitiator taken from the group consisting of a hexaarylbiimidazoles, 4-trichloromethyl-4-methyl-2,5-cyclohexadienones, quinones, alkylaryl ketones and benzophenones; and (c) a sensitizing amount of an N-alkylindolylidene or N-alkylbenzothiazolylidene alkanone of the formula:

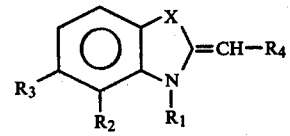

wherein
$R_1$ is $CH_3-(CH_2)_n-$, and n is 0 to 4;
$R_2$ is H;
$R_3$ is $H, CH_3$;
$R_2$ and $R_3$ when taken together form a benzene ring;
$R_4$ is

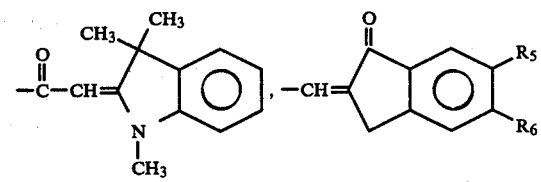

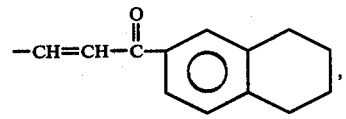

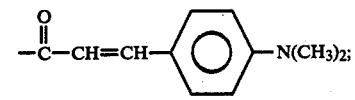

$R_5$ is $H, CH_3O$;
$R_6$ is $H, CH_3O$;
X is >S,

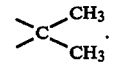

The photopolymerizable compositions comprise at least one ethylenically unsaturated compound, at least one photoinitiator or photoinitiator system, optionally at least one organic polymeric binder, and one or more N-alkylindolylidene or N-alkylbenzothiazolylidene alkanones defined above and described more fully below. Other useful additives in the photopolymerizable composition include: inhibitors, leuco dyes, photoinhibitors, accelerators such as chain transfer agents and oxygen scavengers, as well as inert components such as plasticizers, dyes and pigments to increase visibility of the image, fillers, etc.

The ethylenically unsaturated compound (monomer) can be present in the photopolymerizable composition in an amount of 3 to 100 parts by weight, and the organic polymeric binder can be present in an amount of 0 to 97 parts by weight based on the total weight of monomer and binder. The photoinitiator can be present in an amount of 0.001 to 20 parts by weight per 100 parts by weight of the combined weight of ethylenically unsaturated compound and binder. The N-alkylindolylidene or N-alkylbenzothiazolylidene alkanone sensitizer can be present in an amount of 0.001 to 15 parts by weight, preferably 0.1 to 10 parts by weight, per 100 parts by weight of the combined weight of ethylenically unsaturated compound and binder. The other additives can be present in minor amounts known to those skilled in the art.

The ethylenically unsaturated compounds (1) (photopolymerizable monomers of this invention) have a boiling point above 100° C. at normal atmospheric pressure and are capable of forming a high molecular weight polymer by photoinitiated, addition polymerization. Suitable compounds are disclosed in Chang U.S. Pat. No. 3,756,827, column 2, line 36 to column 3, line 30, the disclosure of which is incorporated herein by reference. Other useful monomers include ethylenically unsaturated diester polyhydroxy polyethers as described in Chambers U.S. Pat. No. 4,245,031. Examples include the Epocryl ® resins sold by Shell Chemical Co. Many of the polymerizable monomers are subject to thermal polymerization, especially when stored for long periods or at elevated temperatures. When such compounds are supplied commercially, it is customary for them to contain a small, but effective, amount of a thermal polymerization inhibitor. These inhibitors may be left in the monomers when the photopolymerizable coating compositions of this invention are prepared, as was done in the examples which follow. The resulting compositions usually have satisfactory thermal stability. If unusual thermal exposure is anticipated, or if monomers containing little or no thermal polymerization inhibitor are employed, compositions with adequate shelf life can be obtained by incorporating, e.g., up to 0.5 percent, by weight of monomer, of a thermal polymerization inhibitor such as hydroquinone, methylhydroquinone, p-methoxyphenol, etc. Preferred ethylenically unsaturated compounds are tetraethylene glycol dimethacrylate and trimethylolpropane triacrylate.

Useful photoinitiators compound types include: hexaarylbiimidazole compounds which are preferred, 4-trichloromethyl-4-methyl-2,5-cyclohexadienones, quinones, alkylaryl ketones and benzophenones. The biimidazoles are photodissociable to the corresponding triarylimidazolyl radicals. These hexaarylbiimidazoles absorb maximally in the 255–275 nm region, and usually show some, though lesser absorption in the 300–375 nm region. Although the absorption bands tend to tail out to include wavelengths as high as about 430 nm, they normally require light rich in the 255–375 nm wavelengths for their dissociation.

The hexaarylbiimidazoles can be represented by the formula:

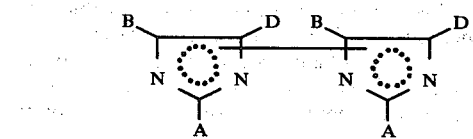

wherein A, B and D represent aryl groups which can be the same or different, carbocyclic or heterocyclic, unsubstituted or substituted with substituents that do not interfere with the dissociation of the hexaarylbiimidazole to the triarylimidazolyl radical or with the oxidation of a leuco dye which may be present, and each dotted circle stands for four delocalized electrons (i.e., two conjugated double bonds) which satisfy the valences of the carbon and nitrogen atoms of the imidazolyl ring. The B and D aryl groups can each be substituted with 0–3 substituents and the A aryl groups can be substituted with 0–4 substituents. Useful 2,4,5-triarylimidazolyl dimers are disclosed in Baum & Henry U.S. Pat. No. 3,652,275 column 5, line 44 to column 7, line 16, the disclosure of which is incorporated herein by reference.

Useful quinone types are: camphorquinone, substituted or unsubstituted polynuclear quinones which are compounds having two intracyclic carbon atoms in a conjugated carbocyclic ring system, e.g., 9,10-anthraquinone, 1-chloroanthraquinone, 2-chloroanthraquinone, 2-methylanthraquinone, 2-ethylanthraquinone, 2-tert-butylanthraquinone, octamethylanthraquinone, 1,4-naphthoquinone, 9,10-phenanthrenequinone, 1,2-benzanthraquinone, 2,3-benzanthraquinone, 2-methyl-1,4-napththoquinone, 2,3-dichloronaphthoquinone, 1,4-dimethylanthraquinone, 2,3-dimethylanthraquinone, 2-phenylanthraquinone, 2-3-diphenylanthraquinone, sodium salt of anthraquinone alpha-sulfonic acid, 3-chloro-2-methylanthraquinone, retenequinone, 7,8,9,10-tetrahydronaphthacenequinone, 1,2,3,4-tetrahydronaphthacenequinone, and 1,2,3,4-tetrahydrobenz(a)anthracene-7,12-dione.

Useful alkylaryl ketones include: vicinal ketaldonyl alcohols such as benzoin, pivaloin, acryloin ethers, e.g., benzoin methyl ether, benzoln ethyl ether, benzoin isopropyl ether, benzoin phenyl ether, benzoin t-butyl ether, benzoin sec-butyl ether, benzoin isobutyl ether, benzoin n-butyl ether; α-hydrocarbon-substituted aromatic acryloins, including α-methylbenzoin, α-allylbenzoin and α-phenylbenzoin, benzoin dialkyl ketals such as benzil dimethylketal, benzil ethyleneglycol ketal, benzil, benzoin esters such as O-acetyl benzoin and O-acylated oximinoketones such as 1-phenyl-1,2-propanedione-2-O-benzoyloxime.

Benzophenones useful as photoinitiators include: benzophenone, 4,4'-dichlorobenzophenone, fluorenone, anthrone, thioxanthone, xanthone, Michler's ketone, 4-dimethoxyaminobenzophenone, 4-morpholinobenzophenone.

4-Trichloromethyl-4-methyl-2,5-cyclohexadienone compounds useful in this invention are disclosed in Sysak U.S. Pat. No. 4,341,860, the disclosure of which is incorporated by reference. Useful such compounds include:
4-methyl-4-trichloromethyl-2,5-cyclohexadienone
2,6-dimethyl-4-trichloromethyl-2,5-cyclohexadienone
3,4-dimethyl-4-trichloromethyl-2,5-cyclohexadienone
4-nonyl-4-trichloromethyl-2,5-cyclohexadienone
4-trichloromethyl-3,4,5-trimethyl-2,5-cyclohexadienone
2,6-di-(t-butyl)-4-trichloromethyl-2,5-cyclohexadienone
2,6-di(t-butyl)-4-methyl-4-trichloromethyl-2,5-cyclohexadienone
2,6-dichloro-4-methyl-4-trichloromethyl-2,5-cyclohexadieneone
2,6-dibromo-4-methyl-4-trichloromethyl-2,5-cyclohexadienone
2,4-dimethyl-4-trichloromethyl-2,5-cyclohexadienone
4-trichloromethyl-2,4,5-trimethyl-2,5-cyclohexadienone 4-phenyl-4-trichloromethyl-2,5-cyclohexadienone
2-methoxy-4-methyl-4-trichloromethyl-2,5-cyclohexadienone
2,6-dimethoxy-4-methyl-4-trichloromethyl-2,5-cyclohexadienone
2,3-benzo-4-methyl-4-trichloromethyl-2,5-cyclohexadienone
2,4,6-tri(t-butyl)-4-trichloromethyl-2,5-cyclohexadienone
4-trichloromethyl-2,4,6-trimethyl-2,5-cyclohexadienone
4-t-butyl-4-trichloromethyl-2,5-cyclohexadienone
2,3,4,5,6-pentamethyl-4-trichloromethyl-2,5-cyclohexadienone
2,4,6-tri(t-pentyl)-4-trichloromethyl-2,5-cyclohexadienone
4-benzyl-4-trichloromethyl-2,5-cyclohexadienone
2-t-butyl-4-trichloromethyl-2,5-cyclohexadienone
2-i-propyl-4-methyl-4-trichloromethyl-2,5-cyclohexadienone
2-t-butyl-4-methyl-4-trichloromethyl-2,5-cyclohexadienone
2-ethyl-4,5-dimethyl-4-trichloromethyl-2,5-cyclohexadienone
2,3-benzo-4,5-dimethyl-4-trichloromethyl-2,5-cyclohexadienone Additional useful compounds are similarly substituted -4-dichloromethyl-2,5-cyclohexadienones as those described above.

The N-alkylindolylidene or N-alkylbenzothiazolylidene alkanone sensitizers useful in the photopolymerizable compositions have been defined broadly above. Preferred sensitizer compounds include:

| Sensitizer | Name of Sensitizer |
|---|---|
| I-1 | 1-(oxacyclopenta-2,4-dien-2-yl)-2-(2,3-dihydro-3-methylnaphtho-3H—[1,2-d]thiazol-2-ylidene)-1-ethanone |
| I-2 | 3-(2,3-dihydro-3-n-butylbenzo-3H—thiazol-2-ylidene)-2-propanone |
| I-3 | 3-(2,3-dihydro-3-n-butyl-5-methylbenzo-3H—thiazol-2-ylidene)-2-propanone |
| I-4 | 3-(2,3-dihydro-3-ethylbenzo-3H—thiazol-2-ylidene)-2-propanone |
| I-5 | 1-(oxacyclopenta-2,4-dien-2-yl)-2-(2,3-dihydro-3-ethyl-5-methylbenzo-3H—thiazol-2-ylidene)-1-ethanone |
| I-6 | 1-phenyl-2-(2,3-dihydro-3-ethyl-5-methylbenzo-3H—thiazol-2-ylidene)-1-ethanone |
| I-7 | 1-phenyl-2-(2,3-dihydro-3-methylnaphtho-3H—[1,2-d] thiazol-2-ylidene-1-ethanone |
| II-1 | 1,3-bis(2,3-dihydro-1,3,3-trimethyl-1H—indol-2-ylidene)-2-propanone |
| III-1 | 1-(2,3-dihydro-1,3,3-trimethyl-1H—indol-2-ylidene)-2-(2,3-dihydro-1H—inden-1-one-2-ylidene)-ethane |
| III-2 | 1-(2,3-dihydro-1,3,3-trimethyl-1H—indol-2-ylidene)-2-(2,3-dihydro-1H—5,6-dimethoxyinden-1-one-2-ylidene)-ethane |
| III-3 | 1-(2,3-dihydro-1,3,3-trimethyl-1H—indol-2-ylidene)-2-(2,3-dihydro-1H—5-methoxyinden-1-one-2-ylidene)-ethane |
| III-4 | 4-(2,3-dihydro-1,3,3-trimethyl-1H—indol-2-ylidene)-1-(5,6,7,8-tetrahydronaphthalene-2-yl)-2-buten-1-one |
| IV-1 | 1-(2,3-dihydro-3-ethylbenzo-3H—thiazol-2-ylidene)-4-p-dimethylaminophenyl-3-buten-2-one |

The formulas for the above sensitizing compounds are as follows:

Sensitizer Compounds

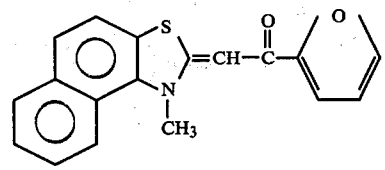
I-1

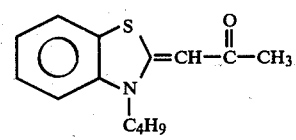
I-2

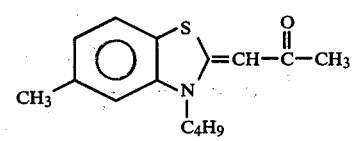
I-3

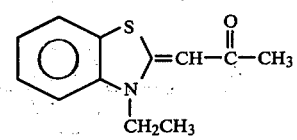
I-4

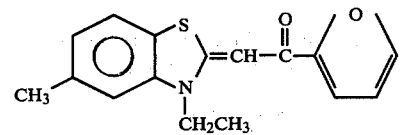
I-5

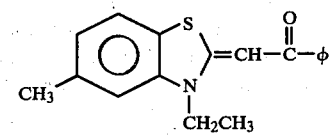
I-6

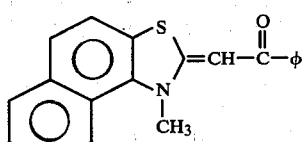
I-7

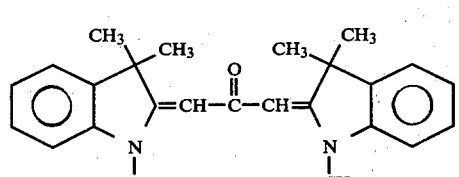
II-1

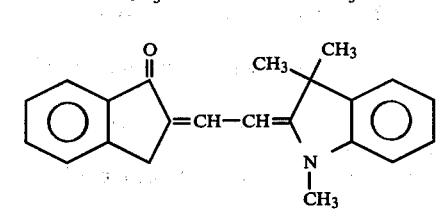
III-1

-continued
Sensitizer Compounds

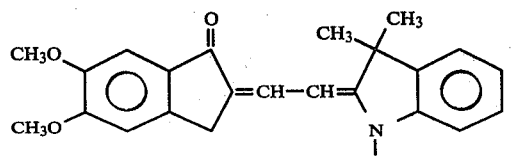

III-2

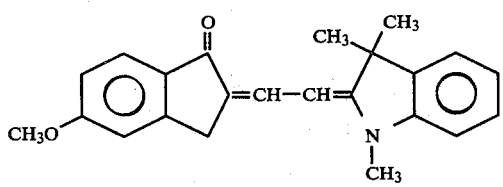

III-3

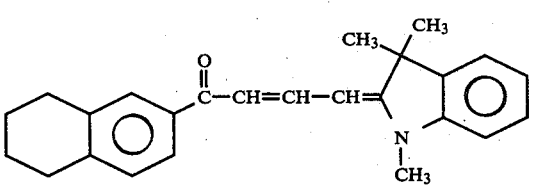

III-4

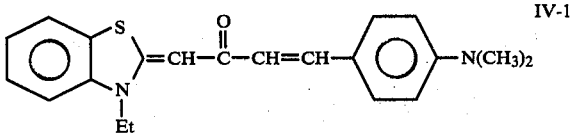

IV-1

The sensitizers of the invention can be prepared according to the following procedures.

Sensitizer I-1 to I-7

The heterocyclic bases used to prepare the sensitizers I-1 to I-7 can be prepared as described by P. Glafkides, "Photographic Chemistry", vol. II, Fountain Press, London, England, 1960, page 768. By way of illustration, 2-methyl-3-ethylbenzothiazolium iodide, used to prepare sensitizer I-4, is prepared by heating 298 g of 2-methylbenzthiazole and 312 g ethyl iodide at 105° C.–110° C. for 20 hours at reflux. The mixture is recrystallized from 720 ml of methanol to yield 478 g of product.

Sensitizers I-1 and I-7 can be prepared as described by P. Glafkides in the same publication described above on page 829. The following sensitizers are prepared by reacting the thiazolium iodide with an acid chloride as set forth above.

I-1: 2,3-dimethylnaphtho-[1,2-d]-thiazolium iodide and 2-furoyl chloride
I-2: 2-methyl-3-n-butylbenzothiazolium iodide and acetyl chloride
I-3: 2,5-dimethyl-3-n-butylbenzothiazolium iodide and acetyl chloride
I-4: 2-methyl-3-ethylbenzothiazolium iodide and acetyl chloride
I-5: 2,5-dimethyl-3-ethylbenzothiazolium iodide and 2-furoyl chloride
I-6: 2,5-dimethyl-3-ethylbenzothiazolium iodide and benzoyl chloride
I-7: 2,3-dimethylnaphtho-[1,2-d]-thiazolium iodide and benzoyl chloride Sensitizer II 1,3-bis(2,3-dihydro-1,3,3-trimethyl-1H-indol-2-ylidene)-2-propanone. Reference M. Coenen, Chem. Ber, 82, 66–72 (1949).

A mixture of 112.5 g Fisher's base and 78.75 g diphenyl carbamoyl chloride in 90 ml xylene is refluxed under $N_2$ for four hours with mechanical stirring. The mixture is cooled to room temperature, and the solid product collected by filtration. The red sample is washed with 300 ml of cold 2B alcohol until yellow crystals are obtained to yield 20.94 g of solid which is recrystallized from 1600 ml of 60/40 (v/v) acetone/ethanol to yield 9.43 g of light yellow crystals, mp 231.5°–232° C.

Sensitizers III-1 to III-4

These compounds are prepared by the reaction of an aryl ketone with Fisher's aldehyde. The general procedure is exemplified with the preparation of Sensitizer III-3 as follows:

1-(2,3-dihydro-1,3,3-trimethyl-1H-indol-2-ylidene)-2-(2,3-dihydro-1H-5-methoxyinden-1-one-2-ylidene)-ethane A solution of 5-methoxyindanone (90 g, 0.5549 mole), Fisher's aldehyde (111.6 g, 0.5545 mole), 360 ml toluene and 12.6 ml piperidine is refluxed for 23 hours with the water collected in a Dean Stark trap. The solution is cooled to 10° C. and the solid is collected by filtration and is washed with cold 2B alcohol. Recrystallization from 3 l of 2B alcohol normally gives about 103.2 g of red, orange needles, mp 199.5°–201.5° C.

Preferably thermoplastic macromolecular organic polymeric binders are present in the photopolymerizable compositions. Polymeric binder types include: (a) copolyesters based on terephthalic, isophthalic, sebacic, adipic and hexahydroterephthalic acids; (b) nylons or polyamides; (c) vinylidene chloride copolymers; (d) ethylene/vinyl acetate copolymers; (e) cellulosic ethers; (f) polyethylene; (g) synthetic rubbers; (h) cellulose esters; (i) polyvinyl esters including polyvinyl acetate/acrylate and polyvinyl acetate/methacrylate copolymers; (j) polyacrylate and poly-α-alkyl-acrylate esters, e.g., polymethyl methacrylate and polyethyl methacrylate; (k) high molecular weight ethylene oxide polymers (polyethylene glycols) having weight average molecular weights from 4000 to 4,000,000; (l) polyvinyl chloride and copolymers; (m) polyvinyl acetal; (n) polyformaldehydes; (o) polyurethanes; (p) polycarbonates; and (q) polystyrenes.

In a particularly preferred embodiment of the invention, the polymeric binder is selected so that the unexposed photopolymerizable coating is soluble in predominantly aqueous solutions, for example dilute aqueous alkaline solutions, but upon exposure to actinic radiation becomes relatively insoluble therein. Typically, polymers which satisfy these requirements are carboxylated polymers, for example vinyl addition polymers containing free carboxylic acid groups. Preferred binders include a 1:1 copolymer of styrene/maleic anhydride partially esterified with an isobutanol mixture, e.g., acid no. ca. 190, wt. ave. mol. wt. ca. 10,000; and a combination of a copolymer of styrene/maleic anhydride and a terpolymer of ethyl acrylate/methylmethacrylate/acrylic acid. Another preferred group of binders includes polyacrylate esters and poly-α-alkyl-acrylate esters, particularly polymethyl methacrylate.

Optionally leuco dyes can also be present in the photopolymerizable composition. By the term "leuco dye" is meant the colorless (i.e., the reduced) form of a dye compound which can be oxidized to its colored form by the triarylimidazolyl radical. Leuco dyes are disclosed in Baum & Henry U.S. Pat. No. 3,652,275, column 7, line 24 to column 11, line 32, the disclosure of which is incorporated herein by reference.

In preferred positive working photopolymerizable compositions, nitroaromatic photoinhibitors as disclosed in Belgian Pat. No. 852,517 granted Sept. 16, 1977, are present. These compounds which can be present in amounts of 0.5 to 15 parts by weight per 100 parts by weight of the combined weight of ethylenically unsaturated compound and binder are defined by the formula:

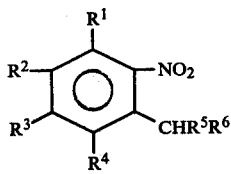

wherein $R^1$ is H, $R^4$ is H, $R_2$ and $R_3$ are alike or different, are H, OH, halogen, $NO_2$, CN, alkyl of 1 to 18 carbons, alkoxy in which the alkyl is of 1 to 18 carbons, aryl of 6 to 18 carbons, benzyl, halogen-substituted phenyl, polyether of 2 to 18 carbons and 1 to 6 oxygens, dialkylamino in which each alkyl is of 1 to 18 carbons, thioalkyl in which the alkyl is of 1 to 18 carbons, or thioaryl in which the aryl is of 6 to 18 carbons, or any two of $R^1$, $R^2$, $R^3$ and $R^4$, taken together, are the residue of a second benzene ring fused onto the benzene nucleus, with the proviso that not more than one of $R^2$ and $R^3$ is OH or $NO_2$;

$R^5$ is H, alkyl of 1 to 18 carbons, halogen, phenyl, or alkoxy in which the alkyl is of 1 to 18 carbons;

$R^6$ is H, OH, alkyl of 1 to 18 carbons, phenyl, or alkoxy in which the alkyl is of 1 to 18 carbons, with the proviso that only one of $R^5$ and $R^6$ is H, or;

$R^5$ and $R^6$ together are $=O$, $=CH_2$, $-O-CH_2-$; $=NC_6H_5$, $=NC_6H_4N(alkyl)_2$ in which each alkyl is of 1 to 18 carbons, $-O-C_2H_4-O-$,

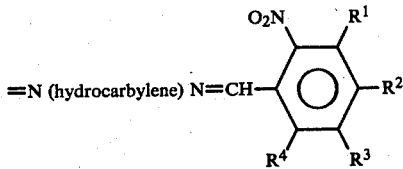

in which the hydrocarbylene group is of 1 to 18 carbons, or

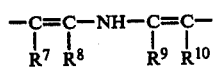

in which $R^8$ and $R^9$, alike or different, are H or alkyl of 1 to carbons, and $R^7$ and $R^{10}$, alike or different, are $-CN$, $-COR^{11}$ in which $R^{11}$ is alkyl of 1 to 5 carbons, or $-COOR^{12}$ in which $R^{12}$ is alkyl of 1 to 6 carbons which may be interrupted by an oxygen atom, alkenyl of 2 to 5 carbons, alkynyl of 2 to 5 carbons, or $R^7$ and $R^8$ together, or $R^9$ and $R^{10}$ together, complete a 6-membered carbocyclic ring containing a keto group.

Accelerators or reducing agents such as oxygen scavengers and active hydrogen doners acting as chain transfer agents are useful additions to compositions to improve photospeed. Oxygen scavengers that have been found to be useful are phosphines, phosphonates, phosphites, stannous salts and other compounds that are easily oxidized by oxygen. Useful chain transfer agents are N-phenyl glycine, trimethylbarbituric acid, 2-mercaptobenzoxazole, 2-mercaptobenzothiazole, and other compounds that have hydrogens that are readily abstractable by radicals.

A wide range of nonpolymerizable plasticizers are effective in achieving improved exposure and development temperature latitude. When a macromolecular binder is present in the layer, plasticizer selection would be based on those well known in the art to be compatible with it as well as the monomer, dimer, ketone and other components. With acrylic binders, for example, dibutyl phthalate and other esters of aromatic acids; esters of aliphatic polyacids such as diisooctyl adipate, nitrate esters, etc.; aromatic or aliphatic acid esters of glycols, polyoxyalkylene glycols, aliphatic polyols, etc.; alkyl and aryl phosphates; low molecular weight polyester of poly-α-methylstyrenes; chlorinated paraffins; and sulfonamide types may be used. In general, water insoluble plasticizers are preferred for greater high humidity storage stability, but are not necessary to get improved latitude. Other inert additives such as dyes, pigments and fillers are known to those skilled in the art. These additives are generally present in minor amounts and should not interfere with the exposure of the photopolymerizable layer.

The photopolymerizable compositions described herein may be coated on a wide variety of substrates. By "substrate" is meant any natural or synthetic support, preferably one which is capable of existing in a flexible or rigid film or sheet form. For example, the substrate could be a metal sheet or foil, a sheet or film of synthetic organic resin, cellulose paper, fiberboard, and the like, or a composite of two or more of these materials. Specific substrates include alumina-blasted aluminum, anodized aluminum, alumina-blasted polyethylene terephthalate film, polyethylene terephthalate film, e.g., resin-subbed polyethylene terephthalate film, flame or electrostatic discharge treated polyethylene terephthalate film, polyvinyl alcohol-coated paper, crosslinked polyester-coated paper, nylon, glass, cellulose acetate film, heavy paper such as lithographic paper, and the like.

The particular substrate will generally be determined by the use application involved. For example, when printed circuits are produced, the substrate may be a plate which is a copper coating on fiberboard; in the preparation of lithographic printing plates, the substrate is anodized aluminum.

Preferably the layer of the photopolymerizable compositions have a thickness ranging from about 0.0001 inch (~0.0003 cm) to about 0.01 inch (0.025 cm) and are adhered with low to moderate adherence to a thin, flexible, polymeric film support which may transmit radiation actinic to the photopolymerizable layer. The opposite side of the photopolymerizable layer may have adhered thereto a protective cover layer or cover sheet wherein the sheet has less adherence to the layer than the adherence between the film support and the layer. A particularly preferred support is a transparent polyethylene terephthalate film having a thickness of about 0.001 inch (~0.0025 cm). Polyethylene, 0.001 inch (~0.0025 cm) is a preferred cover sheet; polyvinyl alcohol coating is a preferred cover layer.

Any convenient source of actinic radiation providing wavelengths in the region of the spectrum that overlap the N-alkylindolylidene or N-alkylbenzothiazolylidene alkanone sensitizers absorption bands can be used to activate the photopolymerizable compositions for radical formation, image formation and photopolymerization initiation. The light can be natural or artificial, monochromatic or polychromatic, incoherent or coherent, and for high efficiency should correspond closely in wavelengths to the sensitizer's principal absorption bands and should be sufficiently intense to activate a substantial proportion of the sensitizer.

Conventional light sources include fluorescent lamps, mercury, metal additive and arc lamps providing narrow or broad light bands centered near 405, 436 and 546 nm (Hg) wavelengths. Coherent light sources are the pulsed xenon, argon ion, and ionized neon-lasers. Visible emitting cathode ray tubes widely useful in printout systems for writing on photosensitive materials are also useful with the subject compositions. These in general involve an ultraviolet or visible-emitting phosphor internal coating as the means for converting electrical energy to light energy and a fiber optic face plate as the means for directing the radiation to the photosensitive target.

BEST MODE FOR CARRYING OUT THE INVENTION

The best mode is illustrated in Example 29 wherein the sensitizer compound is III-3, 1-(2,3-dihydro-1,3,3-tri-methyl-1H-indol-2-ylidene)-2-(2,3-dihydro-1H-5-methoxyinden-1-one-2-ylidene)-ethane This example shows that Sensitizer III-3 yields a photopolymerizable film that has good polymerization photospeed in the visible and which functions well in the presence of a photoinhibitor, which is a compound that before exposure to ultraviolet is not an inhibitor; but after photo-rearrangement, the photo-product is an excellent inhibitor of polymerization and one that can be formed imagewise.

INDUSTRIAL APPLICABILITY

The photopolymerizable compositions of this invention are useful in printing plates for offset and letterpress, engineering drafting films, photoresists in making printed circuits or in chemical milling, and as soldermasks. In printing plate applications, an important use is in a positive/negative two exposure imaging system of a positive photopolymer litho printing plate. The compositions are also useful in positive-working photopolymer litho films. The compositions can be used for preparing colored images from color separation negatives suitable for color-proofing. The images formed from elements made using the compositions may be used for making copies by thermal transfer to a substrate.

Photopolymerizable compositions containing the N-alkylindolylidene and N-alkylbenzothiazolylidene alkanone sensitizers of this invention surprisingly show improved visible light sensitization. The increase in speed results in a saving of energy and related costs since lower energy exposure sources can be used or more elements can be exposed and developed in a given amount of time. Alternatively, the photopolymerizable layer can be exposed by means of an exposure source maintained at a greater distance than normal for known sensitized elements. This permits the exposing radiation to be collimated which is of particular advantage in forming halftone dots having substantially perpendicular sides. The broad sensitization range coupled with the effectiveness of sensitization enable useful positive images to be formed by a double exposure process, first, imagewise in the ultraviolet region of the spectrum and then overall in the visible region of the spectrum utilizing specific nitroaromatic photoinhibitors.

The invention is illustrated by the following examples wherein the parts and percentages are by weight. The molecular weights of polymeric compounds are weight average molecular weights ($\bar{M}w$). The $\bar{M}w$ of the polymers can be determined by using a light scattering technique using known standard samples, e.g., polystyrene, polymethacrylic acid, polymethylmethacrylate, etc., as known to those skilled in the art.

EXAMPLES

EXAMPLES 1 TO 6

These examples illustrate the preparation and imagewise exposure of nonpigmented aqueous washout films using sensitizers I-1 to I-6. The films are prepared by mixing the ingredients set forth in Table 1 in a suitable blender and coating each composition on the resin subbed side of a polyethylene terephthalate film support 0.004 inch (0.01 cm) in thickness using a 0.002 inch (0.005 cm) doctor knife. The films are air dried and a polyethylene terephthalate cover sheet 0.001 inch (0.0025 cm) in thickness is laminated to the dried film at 180° F. (82° C.) at 4 ft/min (121.9 cm/min). A $\sqrt[3]{2}$ step-wedge target is placed over the cover sheet of the film which is placed in a vacuum frame and vacuum is applied. The films are exposed to a 2000 watt mercury photopolymer Addalux lamp having a Berkey Ascor ®1601-40 light source at a distance of 38 inches (96.5 cm) from the film. The exposure units are set forth in Table 1 below. After a two minute hold time the cover sheets are removed. The films are developed for 6 seconds at 22° C. in a developer solution prepared from 84 g potassium carbonate 1.5 hydrate, 5 g potassium hydrogen carbonate and 1536 g distilled water. Immediately after development the films are spray rinsed with water at 32° C. at a pressure of 40 psi (2.81 Kg/sq cm). The number of $\sqrt[3]{2}$ steps of polymeric image and the relative speed of the films are shown in Table 1.

TABLE 1

| | Examples (amount in g) | | |
|---|---|---|---|
| Ingredients | 1 | 2 | 3 |
| Tetraethyleneglycol dimethacrylate | 0.2264 | 0.2264 | 0.2264 |
| Ethyl acrylate (56.6), methyl methacrylate (37.6), acrylic acid (7.0) terpolymer, acid no. 76–85; wt. av. mol. wt. ca. 100,000 | 0.5327 | 0.5327 | 0.5327 |
| Styrene/maleic anhydride copolymer (1.4/1) weight ratio | 0.5539 | 0.5539 | 0.5539 |
| Bis(2-o-chlorophenyl-4,5-diphenyl)imidazole | 0.1298 | 0.1298 | 0.1298 |

TABLE 1-continued

| Sensitizer | | | |
|---|---|---|---|
| I-1 | 0.0113 | — | — |
| I-2 | — | 0.0091 | — |
| I-3 | — | — | 0.0096 |
| I-4 | — | — | — |
| I-5 | — | — | — |
| I-6 | — | — | — |
| Methylene chloride | 7.95 | 7.95 | 7.95 |
| Methanol | 0.60 | 0.60 | 0.60 |
| Units exposure | 10 | 10 | 10 |
| $\sqrt[V]{2}$ Steps of polymeric image | 14 | 13 | 14 |
| Relative speed | 1 | 0.8 | 1 |

| | Examples (amount in g) | | |
|---|---|---|---|
| Ingredients | 4 | 5 | 6 |
| Tetraethyleneglycol dimethacrylate | 0.2264 | 0.2264 | 0.2264 |
| Ethyl acrylate (56.6), methyl methacrylate (37.6), acrylic acid (7.0) terpolymer, acid no. 76–85; wt. av. mol. wt. ca. 100,000 | 0.5327 | 0.5327 | 0.5327 |
| Styrene/maleic anhydride copolymer (1.4/1) weight ratio | 0.5539 | 0.5539 | 0.5539 |
| Bis(2-o-chlorophenyl-4,5-diphenyl)imidazole | 0.1298 | 0.1298 | 0.1298 |
| Sensitizer | | | |
| I-1 | — | — | — |
| I-2 | — | — | — |
| I-3 | — | — | — |
| I-4 | 0.0081 | — | — |
| I-5 | — | 0.0105 | — |
| I-6 | — | — | 0.0109 |
| Methylene chloride | 7.95 | 7.95 | 7.95 |
| Methanol | 0.60 | 0.60 | 0.60 |
| Units exposure | 10 | 10 | 10 |

TABLE 1-continued

| | | | |
|---|---|---|---|
| $\sqrt[V]{2}$ Steps of polymeric image | 14 | 16 | 19 |
| Relative speed | 1 | 1.6 | 3.2 |

EXAMPLES 7 TO 16

These examples illustrate the preparation and imagewise exposure of nonpigmented aqueous washout films using Sensitizer II-1. The films, 7 to 14, are prepared, exposed and developed as described in Examples 1 to 6 using the ingredients set forth in Table 2. The films of Examples 7 to 16 are developed for 6 seconds. The number of $\sqrt[V]{2}$ steps of polymeric image and the relative speed of the films are shown in Table 2. Example 7 is a control. Films 15 and 16 (ingredients set forth in Table 2) are coated with a 0.002 inch (0.05 mm) doctor knife held rigid as the film base is passed underneath at 6 feet/minute (1.83 meter/minute). The coated film passes through a 120° F. (49° C.) forced draft air dryer with a contact time of 2 minutes and is laminated at 180°–195° F. (82°–90° C.) at 40 psi (2.81 kg/sq cm). The laminate is then exposed and developed as described in Examples 1 to 6.

TABLE 2

| | Examples (amount in g) | | | | | | | | | |
|---|---|---|---|---|---|---|---|---|---|---|
| Ingredients | 7 | 8 | 9 | 10 | 11 | 12 | 13 | 14[1] | 15 | 16[2] |
| Tetraethyleneglycol dimethacrylate | 0.2294 | 0.2294 | 0.2294 | 0.2294 | 0.2294 | 0.2294 | 0.2294 | 1.79 | 0.2294 | 0.2294 |
| Terpolymer of Examples 1–6 | 0.5398 | 0.5398 | 0.5398 | 0.5398 | 0.5398 | 0.5398 | 0.5327 | 3.56 | 0.5398 | 0.5398 |
| Styrene/maleic anhydride copolymer of Examples 1–6 | 0.5612 | 0.5612 | 0.5612 | 0.5612 | 0.5612 | 0.5612 | 0.5539 | 3.78 | 0.5612 | 0.5612 |
| Sensitizer II-1 | 0.0134 | 0.0134 | 0.0134 | 0.0134 | 0.0134 | 0.0134 | 0.0138 | — | 0.0286 | — |
| Camphorquinone | — | 0.0707 | — | — | — | — | — | — | — | — |
| Ethyl anthraquinone | — | — | 0.0707 | — | — | — | — | — | — | — |
| Benzophenone | — | — | — | 0.0707 | — | — | — | — | — | — |
| Benzoin methyl ether | — | — | — | — | 0.0707 | — | — | — | — | — |
| 9-Xanthenone | — | — | — | — | — | 0.0707 | — | — | — | — |
| Bis(2-o-chlorophenyl-4,5-diphenyl)imidazole | — | — | — | — | — | — | — | 0.1298 | 0.87 | — |
| 2,6-dibromo-4-methyl-4-trichloromethyl-2,5-cyclohexadienone | — | — | — | — | — | — | — | — | 0.0715 | 0.0715 |
| Methylene chloride | 8.06 | 8.06 | 8.06 | 8.06 | 8.06 | 8.06 | 7.95 | 52.82 | 8.06 | 8.06 |
| Methanol | 0.61 | 0.61 | 0.61 | 0.61 | 0.61 | 0.61 | 0.60 | 4.01 | 0.61 | 0.61 |
| Units exposure | 200 | 50 | 50 | 200 | 200 | 50 | 50 | 200 | 100 | 1000 |
| $\sqrt[V]{2}$ Steps of polymeric image | 5 | 8 | 8 | 8 | 5 | 6 | 9 | 15 | 10 | 0 |
| Relative speed | 1 | 8 | 8 | 2 | 4 | 1.3 | 500 | 10 | 6.3 | ≦0.06 |

[1]Example 14 is a control with no sensitizer.
[2]Example 16 is a control with no sensitizer.

EXAMPLES 17 TO 19

These examples illustrate the preparation and imagewise exposure of nonpigmented aqueous washout films using Sensitizers III-1 to III-3. The films are prepared, exposed and developed as described in Examples 1 to 6 with the exception of Example 19 which was coated as Examples 15 and 16 using the ingredients set forth in Table 3. The films of Examples 17 and 18 are developed for 7 seconds and the film of Example 19 is developed for 5 seconds. The number of $\sqrt[V]{2}$ steps of polymeric image and the relative speed of the film are shown in Table 3.

TABLE 3

| Ingredients | Examples (amount in g) | | |
|---|---|---|---|
| | 17 | 18 | 19 |
| Tetraethyleneglycol dimethacrylate | 0.2264 | 0.2264 | 0.2264 |
| Terpolymer of Examples 1-6 | 0.5327 | 0.5327 | 0.5398 |
| Styrene/maleic anhydride copolymer (1.4/1) weight ratio | 0.5539 | 0.5539 | 0.5612 |
| Bis(2-o-chlorophenyl-4,5-di-phenyl)imidazole | 0.1298 | 0.1298 | — |
| 2,6-dibromo-4-methyl-4-trichloromethyl-2,5-cyclohexadienone | — | — | 0.0715 |
| Sensitizer | | | |
| III-1 | 0.0117 | — | 0.0117 |
| III-2 | — | 0.139 | — |
| Methylene chloride | 7.95 | 7.95 | 8.06 |
| Methanol | 0.60 | 0.60 | 0.61 |
| Units exposure | 10 | 10 | 500 |
| $\sqrt[3]{2}$ Steps of polymeric image | 19 | 16 | 7 |

EXAMPLES 20 TO 24

Examples 21 to 24 illustrate the utility of several sensitizers of the invention in a two exposure positive-working film. The films are prepared as described in Examples 1 to 6 using the ingredients set forth in Table 4. The films, other than the control, are exposed as indicated in Table 4 with a full spectrum exposure using the exposure source described in Examples 1 to 6. After this exposure, the photomask is removed and an ultraviolet filter is placed over the films. The ultraviolet filter is prepared by coating a solution of 720.0 g cellulose acetate butyrate, 320.0 g ethyl Cellosolve ® and 80.0 g ultraviolet absorber, 2,2'-dihydroxy-4-methoxybenzophenone on a 0.004 inch (0.01 cm) thick resin-subbed polyethylene terephthalate film to a dry thickness of 0.00095 inch (0.024 mm). An overall exposure to visible light polymerizes the nonimaged area. The films are then developed as described in Examples 1 to 6 for the periods of time described in Table 4. The number of completely unpolymerized positive $\sqrt[3]{2}$ steps as a result of the two exposures and number of polymerized $\sqrt[3]{2}$ steps when imaged only with visible light are stated in Table 4.

TABLE 4

| Ingredients | Examples (amount in g) | | |
|---|---|---|---|
| | 20[1] | 21 | 22 |
| Tetraethyleneglycol dimethacrylate | 0.2264 | 0.2264 | 0.2264 |
| Terpolymer of Examples 1-6 | 0.5327 | 0.5327 | 0.5327 |
| Styrene/maleic anhydride copolymer (1.4/1) weight ratio | 0.5539 | 0.5539 | 0.5539 |
| Bis(2-o-chlorophenyl-4,5-di-phenyl)imidazole | 0.1298 | 0.1298 | 0.1298 |
| 2-Nitro-4,5-dimethoxybenzaldehyde | 0.0407 | 0.0407 | 0.407 |
| Sensitizer | | | |
| III-1 | 0.0117 | — | — |
| III-2 | — | — | — |
| III-3 | — | 0.0128 | — |
| III-4 | — | — | 0.0132 |
| Methylene chloride | 7.95 | 7.95 | 7.95 |
| Methanol | 0.61 | 0.61 | 0.61 |
| Units imagewise exposure | — | 10 | 10 |
| Units polymerization exposure | 30 | 30 | 30 |
| Number of completely unpolymerized positive $\sqrt[3]{2}$ steps as a result of the two exposures | — | 8 | 2 |
| Number of polymerized $\sqrt[3]{2}$ steps when imaged only with visible light | 9 | 16 | 11 |
| Development time (sec) | 6 | 4 | 6 |

TABLE 4-continued

| Ingredients | Examples (amount in g) | |
|---|---|---|
| | 23 | 24 |
| Tetraethyleneglycol dimethacrylate | 0.2264 | 0.2264 |
| Terpolymer of Examples 1-6 | 0.5327 | 0.5327 |
| Styrene/maleic anhydride copolymer (1.4/1) weight ratio | 0.5539 | 0.5539 |
| Bis(2-o-chlorophenyl-4,5-di-phenyl)imidazole | 0.1298 | 0.1298 |
| 2-Nitro-4,5-dimethoxybenzaldehyde | 0.0407 | 0.0407 |
| Sensitizer | | |
| III-1 | — | — |
| III-2 | 0.0139 | — |
| III-3 | — | — |
| III-4 | — | — |
| I-7 | — | 0.0109 |
| Methylene chloride | 7.95 | 7.95 |
| Methanol | 0.61 | 0.61 |
| Units imagewise exposure | 10 | 10 |
| Units polymerization exposure | 30 | 30 |
| Number of completely unpolymerized positive $\sqrt[3]{2}$ steps as a result of the two exposures | 6 | 8 |
| Number of polymerized $\sqrt[3]{2}$ steps when imaged only with visible light | 14 | 10 |
| Development time (sec) | 5 | 3 |

[1]Example 20 is a control since it only undergoes a polymerization exposure.

EXAMPLE 25

Example 25 illustrates the use of Sensitizer IV-1 in a nonpigmented aqueous washout film which was prepared, exposed and developed as described in Examples 1-6. The film composition, exposure and development data and results are listed in Table 5.

TABLE 5

| Ingredients | (amount in g) |
|---|---|
| Tetraethyleneglycol dimethacrylate | 0.2264 |
| Terpolymer of Examples 1-6 | 0.5327 |
| Copolymer of styrene/maleic anhydride described in Examples 1-6 | 0.5539 |
| Bis(2-o-chlorophenyl-4,5-diphenyl)imidazole | 0.1298 |
| Sensitizer IV-1 | 0.0130 |
| Methylene chloride | 7.95 |
| Methanol | 0.61 |
| Units exposure | 30 |
| Development time (seconds) | 6 |
| Number of $\sqrt[3]{2}$ steps of polymer | 15 |

EXAMPLES 26 TO 28

These examples illustrate the preparation and use of sensitizers of the invention in photoresist films. The compositions described in Table 6 are coated on 0.0092 inch (0.023 cm) thick polyethylene terephthalate supports using a 0.008 inch (0.020 cm) doctor knife. The coatings are air dried for 0.5 hour and a cover sheet of 0.001 inch (0.0025 cm) polyethylene is laminated to each coating. The cover sheets are removed and each film is laminated at 200° F. (ca 93° C.) at 2 ft/min (about 61 cm/min) at 40 psi (2.81 kg/sq cm) to copper clad epoxy laminate boards previously scrubbed with pumice and water and buffed dry. The laminated boards are exposed through a $\sqrt{2}$ stepwedge with the same actinic radiation source as described in Examples 1 to 6. The units of exposure required to give 24 $\sqrt{2}$ steps of polymeric image is set forth in Table 6 below. After a 15-minute hold time the exposed boards are developed at 105° F. (about 41° C.) for one minute which is two times the time required to develop a non-imaged board in a solution of 400 g sodium carbonate, 43 liters water and 10 ml of a nonionic surfactant based on condensates of propylene oxide with hydrophilic bases of condensed ethylene oxide/ethylene glycol.

TABLE 6

| Ingredients | Examples (amount in g) | | |
|---|---|---|---|
| | 26 | 27 | 28 |
| Trimethylolpropane triacrylate | 2.2248 | 2.2248 | 2.2248 |
| Copolymer of styrene/maleic anhydride partially esterified with isobutanol mixture; acid #190; wt. ave. mol. wt. ca. 10,000 | 2.4751 | 2.4751 | 2.4751 |
| Methyl methacrylate (71), ethyl acrylate (17) and acrylic acid (12) terpolymer; wt. ave. mol. wt. ca. 150,000 | 1.6503 | 1.6503 | 1.6503 |
| Methyl methacrylate (55), ethyl acrylate (35), acrylic acid (10); wt. ave. mol. wt. ca. 50,000 | 1.2182 | 1.2182 | 1.2182 |
| p-Toluene sulfonic acid | 0.0083 | 0.0083 | 0.0083 |
| Benzophenone | 0.4132 | 0.4132 | 0.4132 |
| Bis(2-o-chlorophenyl-4,5-diphenyl)imidazole | 0.1653 | 0.1653 | 0.1653 |
| Benzotriazole | 0.0330 | 0.0330 | 0.0330 |
| 1,4,4-Trimethyl-2,3-diazobicyclo-[3.2.2]non-2-ene-N,N'—dioxide | 0.0025 | 0.0025 | 0.0025 |
| Leuco crystal violet | 0.0165 | 0.0165 | 0.0165 |
| Victoria green dye | 0.0041 | 0.0041 | 0.0041 |
| Sensitizer | | | |
| II-1 | 0.413 | — | — |
| I-3 | — | 0.413 | — |
| I-5 | — | — | 0.413 |
| Methylene chloride | 22.75 | 22.75 | 22.75 |
| Methanol | 1.98 | 1.98 | 1.98 |
| Units exposure to give 24 $\sqrt{2}$ steps of polymeric image | 32 | 120 | 71 |

EXAMPLE 29

This example illustrates the use of Sensitizer III-3 in a pigmented aqueous washout photopolymer litho film.

A two layer positive and negative working litho film was prepared by coating a clear aqueous dispersion coating solution over a carbon black pigmented bottom layer. The bottom layer composition is given in Table 7. Components 1–4 were stirred for one hour before adding components 5–11. After stirring four hours a slurry of components 12 and 13 was added. After one hour component 14 was added. The solution was coated to a dry weight of 55 mg/dm$^2$ on the resin subbed side of a 0.004 inch (0.01 cm) polyethylene terephthalate film support. The film was dried with 150° F. (65.6° C.) forced draft air.

The bottom layer was overcoated with an aqueous dispersion solution with composition given in Table 8. The aqueous part was stirred as the organic part was added and the mixture was blended at full voltage in a Waring blender for two minutes. A 5% solution of FC-128, an anionic fluorocarbon surfactant manufactured by 3M Company, St. Paul, Minn., was added and the dispersion was coated on top of the black layer to a thickness of 40 mg/dm$^2$ and dried with forced draft air at 220° F. (202° C.). A 0.005 inch (0.0013 cm) polyethylene terephthalate cover sheet was laminated to the photosensitive coating at 110° C. at 10 ft/min (3.05 m/min).

The film was exposed with a 4 kw pulsed xenon source 60 inches (152.4 cm) from the vacuum frame for both UV imagewise (inhibitor forming) and visible, overall polymerization exposures. A UV filter as used for Examples 20–24 was used with the second polymerization exposure.

The exposed film was developed in a Crona-Lite ® processor (E. I. duPont de Nemours and Company, Wilmington, Del.) with developer solution as described in Examples 1 to 6 at 85° F. (29.4° C.) and 100° F. (37.8°) spray water rinse at 105 psi (7.38 kg/cm$^2$). The two exposure sequence resulted in positive images of excellent resolution suitable for use as a photomask due to the high optical density of 3.0.

TABLE 7

| Black Layer Composition | Wt. in g |
|---|---|
| (1) Methylene chloride | 633.78 |
| (2) Methyl chloroform | 1205.4 |
| (3) Ethyl Cellosolve | 352.8 |
| (4) 1:1 Copolymer of styrene/maleic anhydride partially esterified with an isobutanol mixture; acid #190; wt. av. mol. wt. ca. 10,000 | 187.81 |
| (5) Tetraethylene glycol dimethacrylate | 33.60 |
| (6) 1-(2,3-Dihydro-1,3,3-trimethyl)-1H—indol-2-ylidene)-2-(2,3-dihydro-1H—5-methoxyinden-1-one-2-ylidene)-ethane | 4.20 |
| (7) 1(2'-Nitro-4',5'-dimethoxyphenyl)-1-p-t-butylphenoxyethane | 25.20 |
| (8) Bis(2-o-chlorophenyl-4,5-di-m-methoxyphenyl)-imidazole | 14.00 |
| (9) Bis(2-o-chlorophenyl-4,5-diphenyl)-imidazole | 14.00 |
| (10) 1,4,4'-Trimethyl-2,3-diazobicyclo-[3.2.2]non-2-ene-N,N'—dioxide | 0.28 |
| (11) FC-430 (nonionic fluorocarbon | 6.58 |

TABLE 7-continued

| Black Layer Composition | Wt. in g |
|---|---|
| surfactant from 3M Co.) 10% in methylene chloride | |
| (12) Trimethylolpropanetriacylate | 33.60 |
| (13) Polyox ® SWR N3000, wt. av. av. mol. wt. ca. 400,000 | 5.53 |
| (14) 25% solids solution in methylene chloride of a roll milled dispersion of carbon black, a furnace black with a mean diameter of 0.075μ with a surface area of 25 sq. meters/g (45%) in terpolymer of Examples 1-6 (55%) | 984.34 |

TABLE 8

| Clear Top Layer Composition | Amount in g |
|---|---|
| A. Aqueous Part | |
| (1) Dionized water | 1611.5 |
| (2) Misco ® AC-392, aqueous dispersion of polyethylene (40%) | 274.75 |
| (3) Aqueous solution of octylphenoxy ethanol (10%) | 84.00 |
| (4) Acrysol ® I-94, aqueous solution of an acrylic latex (30%) from Rohm and Haas Co., Philadelphia, PA | 1053.5 |
| (5) Solution prepared by dissolving 7.2 g zinc oxide and 12.7 g ammonium carbonate in 71.4 g water followed by the addition of 8.7 ml concentrated ammonium hydroxide | 94.36 |
| B. Organic Part | |
| Component (6) in Table 7 | 4.25 |
| Component (7) in Table 7 | 25.20 |
| Component (5) in Table 7 | 33.60 |
| Component (12) in Table 7 | 33.60 |
| Component (8) in Table 7 | 14.00 |
| Component (9) in Table 7 | 14.00 |
| Component (10) in Table 7 | 0.28 |
| Methylene chloride | 202.16 |

EXAMPLES 30 to 33

These examples illustrate the effect of triphenylphosphine as an accelerator in photopolymer films. The films were coated as described in Examples 15 and 16. The films were exposed and developed for 6 seconds as described in Examples 1-6. The compositions and film responses are set forth in Table 9.

TABLE 9

| Ingredients | Examples (amount in g) | | | |
|---|---|---|---|---|
| | 30 | 31 | 32 | 33 |
| Tetraethyleneglycol dimethacrylate | 0.2264 | 0.2264 | 0.2264 | 0.2264 |
| Terpolymer of Examples 1-6 | 0.5327 | 0.5327 | 0.5327 | 0.5327 |
| Copolymer of styrene (1,4)/ maleic anhydride (1.0) | 0.5539 | 0.5539 | 0.5539 | 0.5539 |
| Bis(2-o-chlorophenyl-4,5-diphenyl)imidazole | 0.1298 | 0.1298 | 0.1298 | 0.1298 |
| Sensitizer III-1 | — | — | 0.0117 | 0.0117 |
| Triphenyl phosphine | — | 0.0297 | — | 0.0297 |
| Methylene chloride | 7.95 | 7.95 | 7.95 | 7.95 |
| Methanol | 0.61 | 0.61 | 0.61 | 0.61 |
| Units exposure | 50 | 30 | 10 | 20 |
| No. of √2 steps of polymeric image | 15 | 21 | 17 | 23 |
| Relative | 1 | 6.7 | 8.0 | 15.9 |

TABLE 9-continued

| Ingredients | Examples (amount in g) | | | |
|---|---|---|---|---|
| | 30 | 31 | 32 | 33 |
| photospeed | | | | |

We claim:

1. A photopolymerizable composition consisting essentially of an admixture of
   (a) at least one nongaseous ethylenically unsaturated compound having at least one terminal ethylenically unsaturated group, a boiling point above 100° C. at normal atmospheric pressure and being capable of addition polymerization,
   (b) at least one photoinitiator taken from the group consisting of hexaarylbiimidazoles, 4-trichloromethyl-4-methyl-2,5-cyclohexadienones, quinones, alkylaryl ketones and benzophenones;
   (c) a sensitizing amount of an N-alkylindolylidene or N-alkylbenzothiazolylidene alkanone spectral sensitizer of the formula:

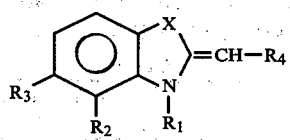

wherein
$R_1$ is $CH_3-(CH_2)_n-$, and n is 0 to 4;
$R_2$ is H;
$R_3$ is H, $CH_3$;
$R_2$ and $R_3$ when taken together form a benzene ring;

$R_4$ is 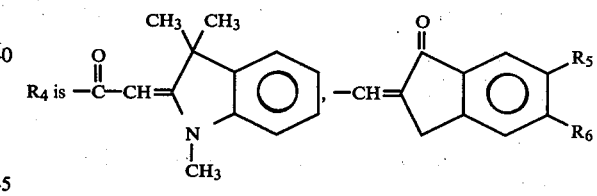

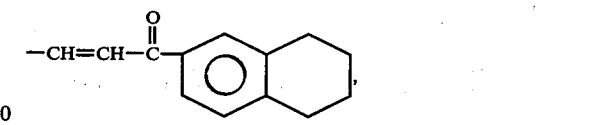

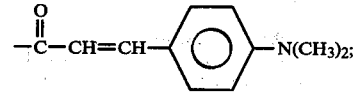

$R_5$ is H, $CH_3O$;
$R_6$ is H, $CH_3O$;
x is >S,

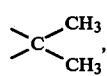

(d) at least one organic polymeric binder.

2. A photopolymerizable composition according to claim 1 wherein the ethylenically unsaturated compound and organic polymeric binder are present in relative amounts of 3 to 100 and 0 to 97 parts by weight, respectively.

3. A photopolymerizable composition according to claim 2 wherein the photoinitiator is present in an amount of 0.001 to 20 parts by weight per 100 parts by weight of the combined weight of ethylenically unsaturated compound and binder.

4. A photopolymerizable composition according to claim 3 wherein the N-alkylindolylidene or N-alkylbenzothiazolylidene alkanone compound is present in an amount of 0.001 to 15 parts by weight per 100 parts by weight of the combined weight of ethylenically unsaturated compound and binder.

5. A photopolymerizable composition consisting essentially of an admixture of
 (a) at least one nongaseous ethylenically unsaturated compound having at least one terminal ethylenically unsaturated group, a boiling point above 100° C. at normal atmospheric pressure and being capable of addition polymerization,
 (b) at least one photoinitiator taken from the group consisting of hexaarylbiimidazoles, 4-trichloromethyl-4-methyl-2,5-cyclohexadienones, quinones, alkylaryl ketones and benzophenones;
 (c) a sensitizing amount of 1,3-bis(2,3-dihydro-1,3,3-trimethyl-1H-indol-2-ylidene)-2-propanone, and
 (d) at least one organic polymeric binder.

6. A photopolymerizable composition consisting essentially of an admixture of
 (a) at least one nongaseous ethylenically unsaturated compound having at least one terminal ethylenically unsaturated group, a boiling point above 100° C. at normal atmospheric pressure and being capable of addition polymerization,
 (b) at least one photoinitiator taken from the group consisting of hexaarylbiimidazoles, 4-trichloromethyl-4-methyl-2,5-cyclohexadienones, quinones, alkylaryl ketones and benzophenones;
 (c) a sensitizing amount of 1-(2,3-dihydro-1,3,3-trimethyl-1H-indol-2-ylidene)-2-(2,3-dihydro-1H-5-methoxyinden-1-one-2-ylidene)-ethane, and
 (d) at least one organic polymeric binder.

7. A photopolymerizable composition consisting essentially of an admixture of
 (a) at least one nongaseous ethylenically unsaturated compound having at least one terminal ethylenically unsaturated group, a boiling point above 100° C. at normal atmospheric pressure and being capable of addition polymerization,
 (b) at least one photoinitiator taken from the group consisting of hexaarylbiimidazoles, 4-trichloromethyl-4-methyl-2,5-cyclohexadienones, quinones, alkylaryl ketones and benzophenones
 (c) a sensitizing amount of 1-(2,3-dihydro-3-ethylbenzo-3H-triazol-2-ylidene)-4-p-dimethylaminophenyl-3-buten-2-one, and
 (d) at least one organic polymeric binder.

8. A photopolymerizable composition according to claim 1 wherein the ethylenically unsaturated compound is tetraethylene glycol dimethacrylate.

9. A photopolymerizable composition according to claim 1 wherein the ethylenically unsaturated compound is trimethylolpropane triacrylate.

10. A photopolymerizable composition according to claim 1 wherein two polymeric binders are present, one being a copolymer of styrene/maleic anhydride and the second a terpolymer of ethyl acrylate/methylmethacrylate/acrylic acid.

11. A photopolymerizable composition according to claim 1 wherein the polymeric binder is a 1:1 copolymer of styrene/maleic anhydride partially esterified with an isobutanol mixture.

12. A photopolymerizable composition consisting essentially of
 (a) tetraethylen glycol dimethacrylate,
 (b) hexaarylbiimidazole,
 (c) sensitizing amount of 1-(2,3-dihydro-1,3,3-trimethyl-1H-indol-2-ylidene)-2-(2,3-dihydro-1H-5-methoxyinden-1-one-2-ylidene)-ethane, and,
 (d) combination of styrene/maleic anhydride copolymer and ethyl acrylate/methyl methacrylate/acrylic acid terpolymer.

13. A photopolymerizable composition according to claim 11 wherein the hexaarylbiimidazole is bis(2-o-chlorophenyl-4,5-diphenyl)imidazole.

14. A photopolymerizable element comprising a support coated with a composition according to claim 1.

15. A photopolymerizable element according to claim 14 wherein the support is a polymeric film.

16. A photopolymerizable element according to claim 14 wherein the support is a metallic surface.

17. A photopolymerizable element according to claim 16 wherein the support is copper.

* * * * *